US007272014B2

(12) United States Patent
Lamp

(10) Patent No.: US 7,272,014 B2
(45) Date of Patent: Sep. 18, 2007

(54) PORTABLE LED UNIT INTERFACE AND POWER SUPPLY

(75) Inventor: Richard Lamp, Las Vegas, NV (US)

(73) Assignee: Production Resource Group, L.L.C., New Windsor, NY (US)

( * ) Notice: Subject to any disclaimer, the term of this patent is extended or adjusted under 35 U.S.C. 154(b) by 557 days.

(21) Appl. No.: 10/817,485

(22) Filed: Apr. 1, 2004

(65) Prior Publication Data

US 2005/0225931 A1 Oct. 13, 2005

(51) Int. Cl.
*H05K 7/20* (2006.01)

(52) U.S. Cl. ........................ 361/788; 361/715; 361/760

(58) Field of Classification Search ................ 361/715, 361/752, 790, 797, 760; 712/310
See application file for complete search history.

(56) References Cited

U.S. PATENT DOCUMENTS 6,717,486 B2 * 4/2004 Khemakhem et al. .... 333/24 R
2005/0248299 A1 * 11/2005 Chemel et al. ............. 315/312

* cited by examiner

*Primary Examiner*—Dean A. Reichard
*Assistant Examiner*—Hung S Bui
(74) *Attorney, Agent, or Firm*—Fish & Richardson P.C.

(57) ABSTRACT

A power supply and control device intended for retrofitting permanently-installed fixtures. The permanently-installed fixtures include permanently-installed power supplies. This device is a portable device which provides power for a plurality of rental fixtures of the type which otherwise would require being permanently installed. The power supply also includes a logic board in the power supply which separates logic signals.

11 Claims, 3 Drawing Sheets

PORTABLE LED UNIT INTERFACE AND POWER SUPPLY

BACKGROUND

Certain lighting units, such as the C-12 light emitting diode (LED) fixture available from Color Kinetics, use special kinds of power supplies with integral logic boards, that are intended for permanent installation. This allows the unit to operate as a permanently installed fixture.

A block diagram of a specific power supply is shown in FIG. 1. The power supply 100 receives both AC power 105, and industry standard DMX control signals 110. The DMX control signals may be as described in the DMX 512 standard, in which many time division multiplexed signals are sent on a single line. The enclosure is designed for permanent installation, and hence includes no connectors, but rather only intends for permanent wire connections.

SUMMARY

The present system teaches a special portable power supply and logic control device intended for use with lighting devices of a type which are normally intended to be permanently installed in a location. This power supply is intended for use in temporary installations, such as would be used when a light intended for permanent installation is used in a rental situation.

The device includes a housing with a first set of connectors to at least one logic board, a power supply which supports operation of multiple units and connectors for the power supply.

BRIEF DESCRIPTION OF THE DRAWINGS

These and other aspects will now be described in detail, with reference to the accompanying drawings, wherein.

DETAILED DESCRIPTION

Figure 2:
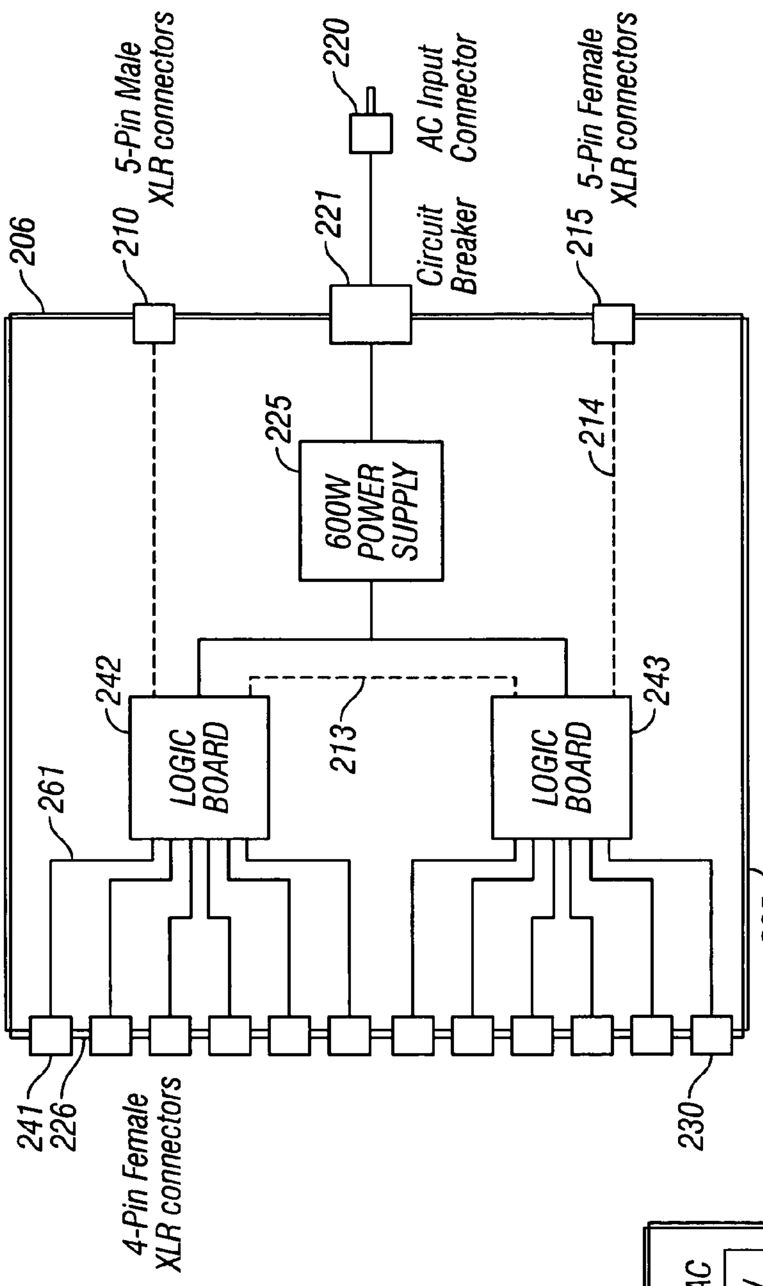
FIG. 2 shows a portable device described according to the present system.
Figure 1:
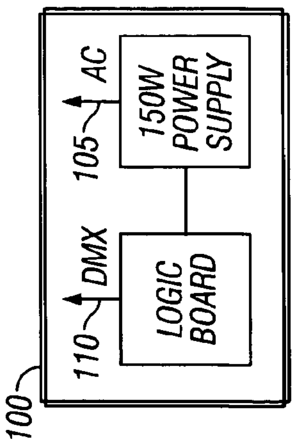
FIG. 1 shows a block diagram of a permanently installed power supply device.

A block diagram of the portable interface device disclosed herein is shown in FIG. 2. FIG. 2 shows a portable housing 205, including a number of connector portions thereon. A first connector wall 206 includes signal connectors 210, 215. The signal connectors are daisy-chained, industry standard, 5-pin XLR connectors. The first male connector 210 is a daisy-chained to a second female connector 215. The daisy-chain allows connecting multiple units 200 to be connected together, from a single DMX logic line. An AC power connector assembly 220 includes AC power and a circuit breaker 221. The input AC power is connected to a power supply, producing power outputs.

A first logic board 242 receives the DMX signal 212 from the connector 210. In this embodiment, the logic board 242 can simply be the exact logic board taken from the power supply circuit 100. Alternatively, logic board 242 can be any logic board which responds to multiplexed signals of any type, and produces specific outputs intended for specific units. For example, the logic board 242 may include a processor that analyzes the DMX signal, and recognizes a signal output for LED light number one, shown as 261 in FIG. 2. This disclosure also encompasses other kinds of logic processing of the signal. The signal within the DMX stream intended for LED number one is separated by the logic board 242 as signal 261.

A second connector wall 226 includes 12 connectors, shown generically as 230. Each of the connectors 230 is a 4-pin female connector of the XLR type carrying logic information and power. Note that the input signal connector 210 is a 5-pin connector, while the output signal connector 230 are 4-pin connectors. The power from power supply 225, and the separated logic signal 261 are coupled to each output connector 230.

The DMX signal 212 is also daisy-chained through the logic board as signal line 213, to a second logic board 243. The second logic board may be logically identical to the first logic board. In addition, the signal is daisy-chained out through signal line 214, and sent out on a daisy-chained output signal connector 215. The signal 215 can be connected to other power supplies using the same DMX signal stream.

The unit therefore separates the walls into a first connector wall 206 for signal in/out, and a second connector wall 226, for signal to lamps power outs.

Power supply 225 may be a 600 W power supply, which supplies power to power the logic boards 242, 243, and also supplies the power to each of the connectors 230 to control the lights themselves. More generally, the power supply 225 needs to have sufficient capability to power all the connectors 230.

Figure 3:
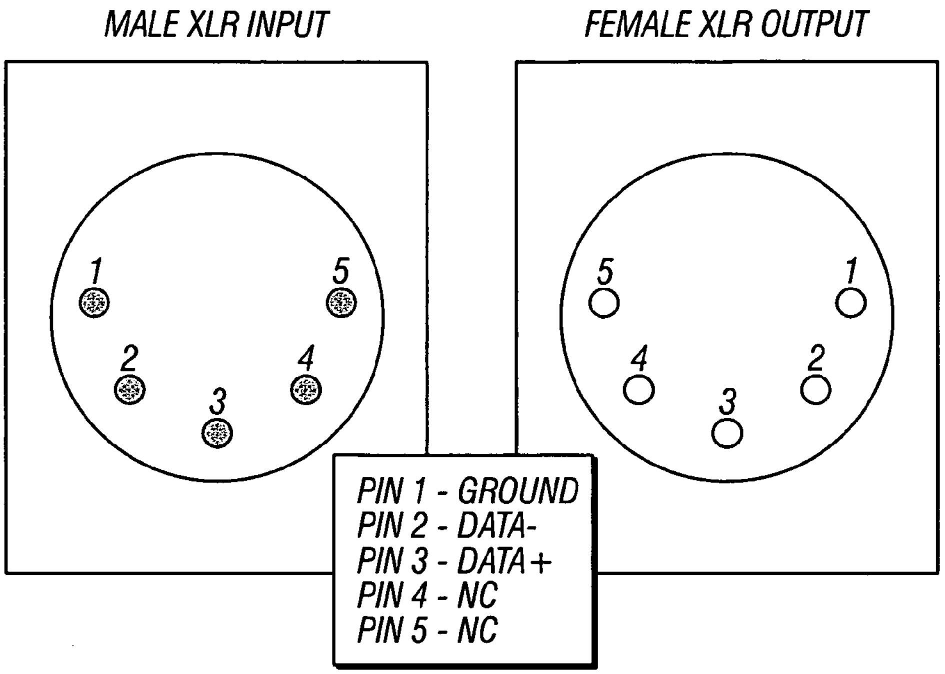
FIGS. 3 and 4 show connector pins and their pin outs.
Figure 4:
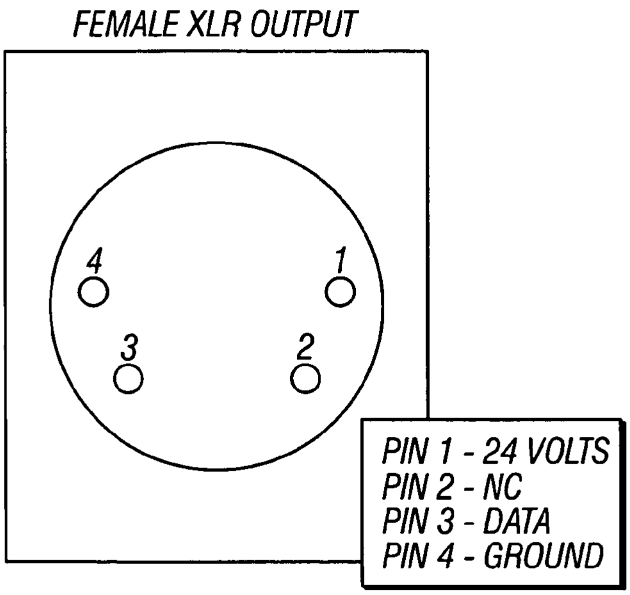

The pin out of the 5-pin connectors 210, 215 are shown in FIG. 3. Connectors include a data plus connection, a data minus connection, and a ground connection as shown. Two pins are unused. FIG. 4 shows the output connectors 230. These are 4-pin connectors which include a data signal, ground and power. The output voltage 252 of the 600 W power supply is 24 volts DC, to match many standard lighting units. For example, this device may be used not only with Color Kinetics' devices The pin-out arrangement is selected such that if the unit is plugged into other mating connectors, such as those on Wybron or Morpheus units, or visa versa no damage is caused.

Figure 5:
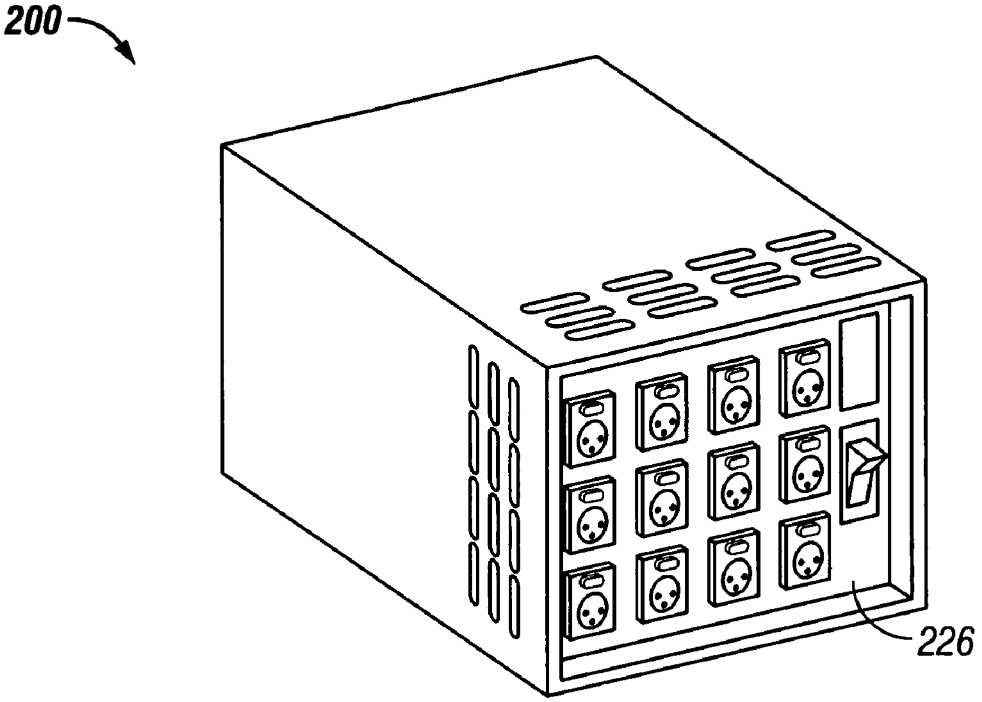
FIGS. 5 and 6 show diagrams of the walls with connectors.

FIG. 5 shows a perspective view of the front of the unit 220 showing the output connector wall 226. All of the output connectors are together on the same wall, along with an on/off switch.

Figure 6:
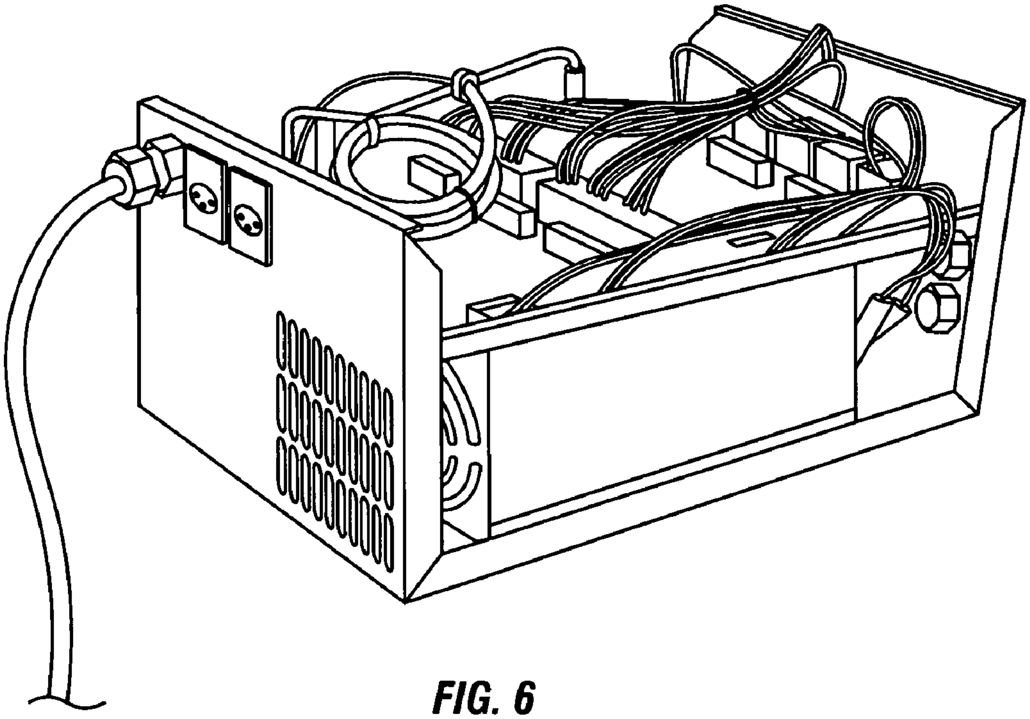

The power and DMX input and output connectors shown in FIG. 6 on the opposite wall. This separates the connectors intended for the lamps, on a different wall from those connectors intended for input power and control. FIG. 6 shows the open case, illustrating the power supply underneath the logic connections.

Although only a few embodiments have been disclosed in detail above, other modifications are possible. All such modifications are intended to be encompassed within the following claims.

What is claimed is:

1. A portable device, comprising:

a housing, defining a first outer wall, and a second outer wall opposite said first outer wall, and including a first signal carrying connector and a second signal-carrying connectors on said first outer wall, and at least a plurality of signal-and-power carrying connectors on said second outer wall;

a power supply, having an output which supplies output power;

at least one logic assembly, connected to receive an output of signal from said first signal carrying connector, and to process said signal to produce individual output signals intended for plural separate lighting fixtures, and producing a plurality of outputs intended for a plurality of different lighting devices, said at least one logic assembly receiving power for its operation from said output of said power supply;

both the output power from said power supply and said outputs from said logic assembly being each connected to one of said signal-and-power carrying connectors on said second outer wall, with each of said second connectors being connected to one of said individual output signals from said logic assembly, and to said output power from said power supply.

2. A device as in claim 1, wherein said second connectors have fewer pins than said first connectors.

3. A device as in claim 1, wherein said first and second signal carrying connectors are daisy-chained to one another.

4. A device as in claim 1, wherein said logic assembly operates on DMX based signals.

5. A device as in claim 1, wherein said logic assembly separates time division multiplexed signals to produce individual outputs for each of a plurality of outputs.

6. A method, comprising:

installing a plurality of lights which are intended for permanent installation with a permanently installed power supply;

powering each of said plurality of lights using a portable power supply; and providing control signals for each of said plurality of lights using the same portable power supply, and using a logic board which is powered from the same power supply which provides power to the lights.

7. A method as in claim 6, further comprising daisy-chaining a control connector through said portable power supply.

8. A method as in claim 7, wherein said daisy-chaining comprises using first and second 5-pin connectors, and said providing power is done over a common 4-pin connector.

9. A portable power and control device, comprising:

a housing, comprising first and second 5-pin connectors intended for respectively receiving and outputting control signals, and a plurality of 4-pin connectors intending for outputting control signals and power signals to external lighting devices;

a logic board, receiving said control signals from said 5-pin connectors, and processing said control signals to produce individual output control signals for each of a plurality of different ones of said 4-pin connectors based on said processing;

a power supply, located in said housing, and providing said power signals to said 4-pin connectors and also providing a power signal for said logic board which powers the circuitry that carries out said processing.

10. A device as in claim 9, wherein said control signals are a single line which includes a plurality of control signals intended for use with a plurality of different lights.

11. A device as in claim 9, wherein said control signal is in DMX format.

* * * * *